United States Patent
Feld et al.

(10) Patent No.: US 6,195,031 B1
(45) Date of Patent: Feb. 27, 2001

(54) ANALOG-TO-DIGITAL CONVERTER WITH LEVEL CONVERTER AND LEVEL RECOGNITION UNIT AND CORRECTION MEMORY

(75) Inventors: Peter Feld, Nuernberg; Horst Kroeckel, Bamberg; Markus Vester, Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/221,048

(22) Filed: Dec. 28, 1998

(51) Int. Cl.⁷ .............................. H03M 1/36; H03M 1/10
(52) U.S. Cl. ................................. 341/159; 341/120
(58) Field of Search ............................ 341/159, 118, 341/120, 131, 161, 138, 139, 121, 141, 156

(56) References Cited

U.S. PATENT DOCUMENTS

| 5,500,644 | * | 3/1996 | Denjean et al. | 341/120 |
| 5,546,081 | | 8/1996 | Baumgartl . | |
| 5,600,317 | * | 2/1997 | Knoth et al. | 341/118 X |
| 5,777,568 | * | 7/1998 | Inoue | 341/118 X |
| 5,777,569 | * | 7/1998 | Naruki et al. | 341/118 X |
| 6,057,891 | * | 5/2000 | Guerin et al. | 341/120 X |
| 6,127,955 | * | 10/2000 | Handel et al. | 341/120 |

* cited by examiner

Primary Examiner—Patrick Wamsley
(74) Attorney, Agent, or Firm—Schiff Hardin & Waite

(57) ABSTRACT

An analog-to-digital converter circuit for digitalizing a high-frequency signal with large dynamics has a first analog-to-digital converter and a second analog-to-digital converter connected in parallel, a level converter connected to one of the two analog-to-digital converters, a level recognition element for determining a level range in which the high-frequency signal lies and for generating a control signal dependent on the level range, and a correction memory that is connected to the level recognition element, the correction memory having address inputs connected to outputs of the analog-to-digital converters. The control signal is used as a selection criterion which identifies which analog-to-digital converter address data are taken from for producing a digital output signal, the digital output signal being linearized according to a characteristic of the selected analog-to-digital converter in order to correct for distortion arising in the selected converter. The overall analog-to-digital converter circuit thus has an overall linear characteristic, even as the input signal varies between low and high amplitudes.

7 Claims, 2 Drawing Sheets

ANALOG-TO-DIGITAL CONVERTER WITH LEVEL CONVERTER AND LEVEL RECOGNITION UNIT AND CORRECTION MEMORY

BACKGROUND OF THE INVENTION

1. Field of the Invention

The present invention is directed to an analog-to-digital converter circuit for digitization of a high-frequency signal in the megahertz range with large dynamics.

2. Description of the Prior Art

U.S. Pat. No. 5,546,081 discloses an analog-to-digital converter circuit for digitizing an amplitude-modulated analog high-frequency signal. For example, the analog-to-digital converter can be utilized in the high-frequency receiver of a diagnostic magnetic resonance apparatus. The analog-to-digital converter circuit has a controllable amplifier that precedes the actual analog-to-digital converter. The output of the analog-to-digital converter is connected to a divider that in turn reduces the digitized signal according to the preceding amplification. Control signals for the amplifier and the divider are determined by a level recognition element. The gain is set on the basis of the recognized level so that the analog-to-digital converter operates with maximum modulation. A disadvantage of this known circuit is that it can satisfy high demands on the linearity of the analog-to-digital conversion only if the amplifier has a constant gain factor that can be exactly set, and a correspondingly linear analog-to-digital converters must be employed. It is thereby a serious problem to operate this circuit for converting signals which require that the modification of the gain ensue rapidly within a sampling time interval.

SUMMARY OF THE INVENTION

An object of the present invention is to provide an analog-to-digital converter circuit for the digitization of a high-frequency signal with large dynamics that can meet a high demand for linearity in the analog-to-digital conversion even without high precision components.

This object is achieved in an analog-to-digital converter circuit according to the invention having a first analog-to-digital converter and a second analog-to-digital converter connected in parallel, a level converter connected to one of the analog-to-digital converters, a level recognition element for determining a level range in which the high-frequency signal lies and for generating a control signal dependent on the level range, and a correction memory that is connected to the level recognition element and whose address inputs are connected to outputs of the analog-to-digital converters. The control signal is used as a selection criterion for selecting analog-to-digital converter address data are taken from for producing a digital output signal. This digital output signal is linearized according to a characteristic of the selected analog-to-digital converter. By employing a correction memory addressable by the analog-to-digital converters, the individual characteristics of the two analog-to-digital converters are combined to form overall linear characteristics for the analog-to-digital converter circuit as the input signal caries between low and high amplitudes. A high precision is thereby possible because deviations from the rated characteristic of the individual analog-to-digital converters can likewise be compensated.

In an embodiment the characteristic is additionally fashioned for the compensation of unwanted distortions that are added to the high-frequency signal by the upstream components. The correction values can be determined in an adjustment step.

In another embodiment an amplifier is utilized as the level converter and that the level recognition element is arranged behind the amplifier. A full modulation of the amplifier thus can be identified without noticeable time delay. An activation of the analog-to-digital converter with larger quantization steps ensues with the control signal emitted by the level recognition element.

In order to compensate for different transit times which may exist in the two analog signal paths, a signal delay element precedes one of the analog-to-digital converters according in another embodiment.

Analog-to-digital converters often have an internal processing time that elapses between the application of an analog input signal and the appearance of the appertaining digital output signal. In certain converter types, this even lasts a number of clock cycles. In order to assure correct allocation of the data, a digital delay element can be inserted following the comparator output.

DESCRIPTION OF THE PREFERRED EMBODIMENTS

Figure 1:
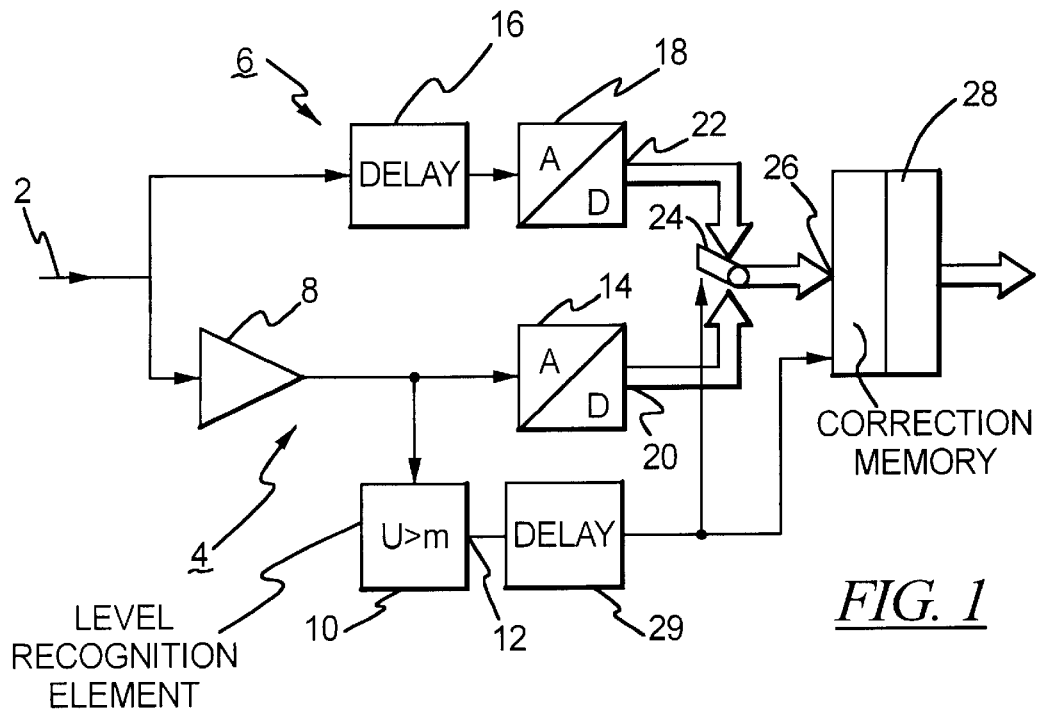
FIG. 1 is a block circuit diagram of a first embodiment of an inventive analog-to-digital converter circuit with an amplifier.

The analog-to-digital converter circuits described below are particularly provided for employment in a digital receiver of a diagnostic magnetic resonance apparatus. The analog-to-digital conversion of the received magnetic resonance signals ensues in an intermediate frequency band having a frequency around approximately 2 MHz. The analog-to-digital converter circuit has an analog input 2 that divides into two parallel branches 4 and 6. A digitization ensues in the first branch 4 when the analog high-frequency signal lies in a first, small level range. If and when this first level range is exceeded, the digitization ensues in the second branch 6. To that end, the first branch 4 contains an amplifier that amplifies the high-frequency signal supplied at the input 2 by a predetermined factor. When the amplified high-frequency signal exceeds a threshold m, a level recognition element 10 following the amplifier 8 emits a control signal at an output 12. The amplified high-frequency signal also is present at an analog input of an analog-to-digital converter 14 for digitization. The digitization ensues, for example, with a word width of 12 bits.

A delay element 16 is arranged in the second branch 6 in order to delay the high-frequency signal to be digitized, so that the signal is subject to identical transit times in the two branches 4 and 6 up to the analog-to-digital conversion. The transit time is mainly predetermined by the amplifier 8. The delay element 16 can be omitted in instances wherein the transit time of the amplifier 8 can be left out of consideration. The unamplified high-frequency signal is supplied to an analog input of a second analog-to-digital converter 18 for digitization. Here, the analog-to-digital converter 18 is of the same type as the analog-to-digital converter 14; the word width likewise amounts to 12 bits.

The respective digital outputs 20 and 22 of the two analog-to-digital converters 14 and 18 are connected to address inputs 26 of a memory 28 via a switch 24. Correction characteristics allocated to the two analog-to-digital converters 14 and 18 are stored in the memory 28; together, these yield a linear overall characteristic for the analog-to-digital converter circuit. The address area comprises 13 bits. The 13$^{th}$ bit indicates the memory area that is to be addressed and is determined by the control signal emitted at the output 12 of the level recognition element 10. The switch 24 also is controlled by the control signal emitted at the output 12. As long as the level recognition element finds that the high-frequency signal to be digitized lies below the threshold m in amplitude, the first analog-to-digital converter 14 is activated. The switch 24 then connects the digital output 20 to the address inputs 26 of the memory 28. The characteristic allocated to the analog-to-digital converter 14 is addressed via the 13$^{th}$ bit (control bit). A characteristic that is inverse relative to the characteristics of the preceding components is stored in the memory 28, so that a linear characteristic of the overall input circuit is achieved. When the level prescribed by the threshold m is exceeded, then the second analog-to-digital converter 18 is activated. The switched 24 connects the digital outputs 22 to the address inputs 26 of the memory 28. The 13$^{th}$ bit predetermined by the control signal from the level recognition element 10 switches over to the corresponding address inputs for the second characteristic with a coarser quantization that is stored in the memory 28. The inverse characteristic of the preceding components is also stored therein as the characteristic. A linear characteristic is achieved overall for the entire range of dynamics to be digitized. Signals with a low level are thereby more finely quantized than signals with a higher level.

If the analog-to-digital converters 14, 18 have a longer internal processing time for the digitalizing, which can be several clock cycles given certain converter types, then a digital delay element 29 can be inserted following the comparator output 12.

Figure 2:
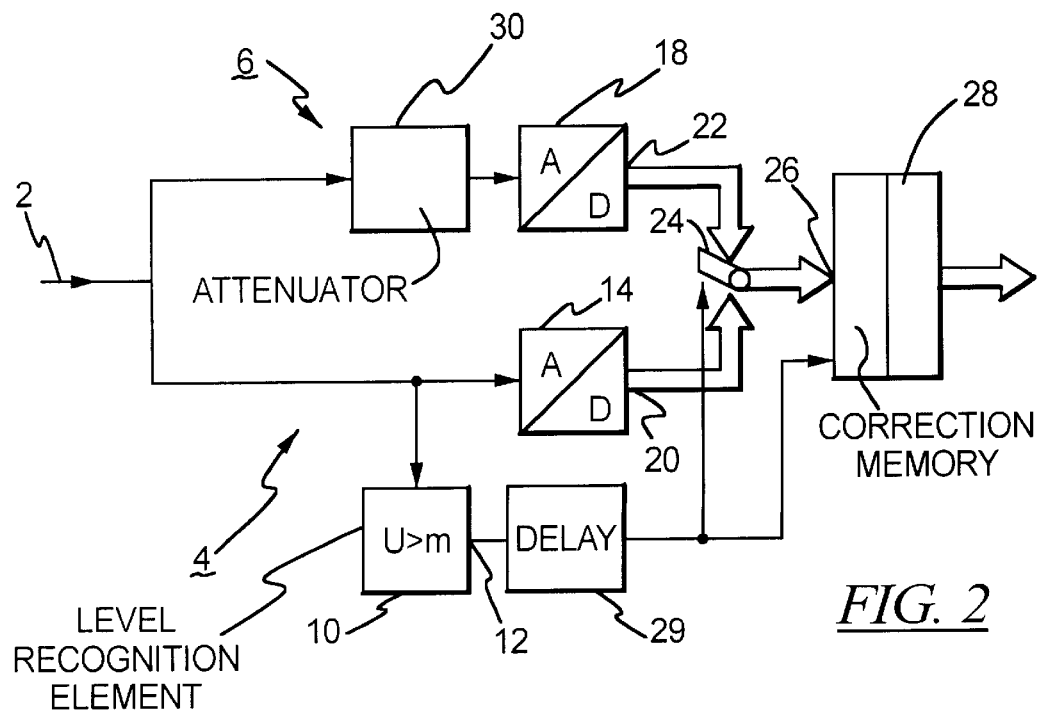
FIG. 2 is a block circuit diagram of a second embodiment of an inventive analog-to-digital converter circuit with an attenuator.

The analog-to-digital converter circuit shown in FIG. 2 differs from the analog-to-digital converter circuit according to FIG. 1 in that an attenuator element 30 is arranged in the second branch 6 instead of an amplifier. The high-frequency signal supplied to the input 2 thus must be correspondingly pre-amplified. One advantage of the attenuator is that it can be constructed as a passive component and a very good time constancy therefore can be more easily achieved. Otherwise, the function of the two analog-to-digital converter circuits is the same.

The level setting for the two analog-to-digital converters 14, 18 is designed such that the analog-to-digital converter 18 is just fully modulated at the maximum level to be anticipated. Due to the limited resolution (dynamics), however, the necessary noise factor cannot be realized by this means alone. The analog-to-digital converter 18 that digitizes small signals with finer steps, and thus with an optimum noise factor is therefore connected in parallel. The control of the switching of the analog-to-digital converters 14, 18 onto the memory 28 uses the positive and negative signal peaks of the high-frequency oscillation. Aliasing effects can be prevented by band filters (not shown) connected preceding the analog-to-digital converters 14, 18.

Figure 3:
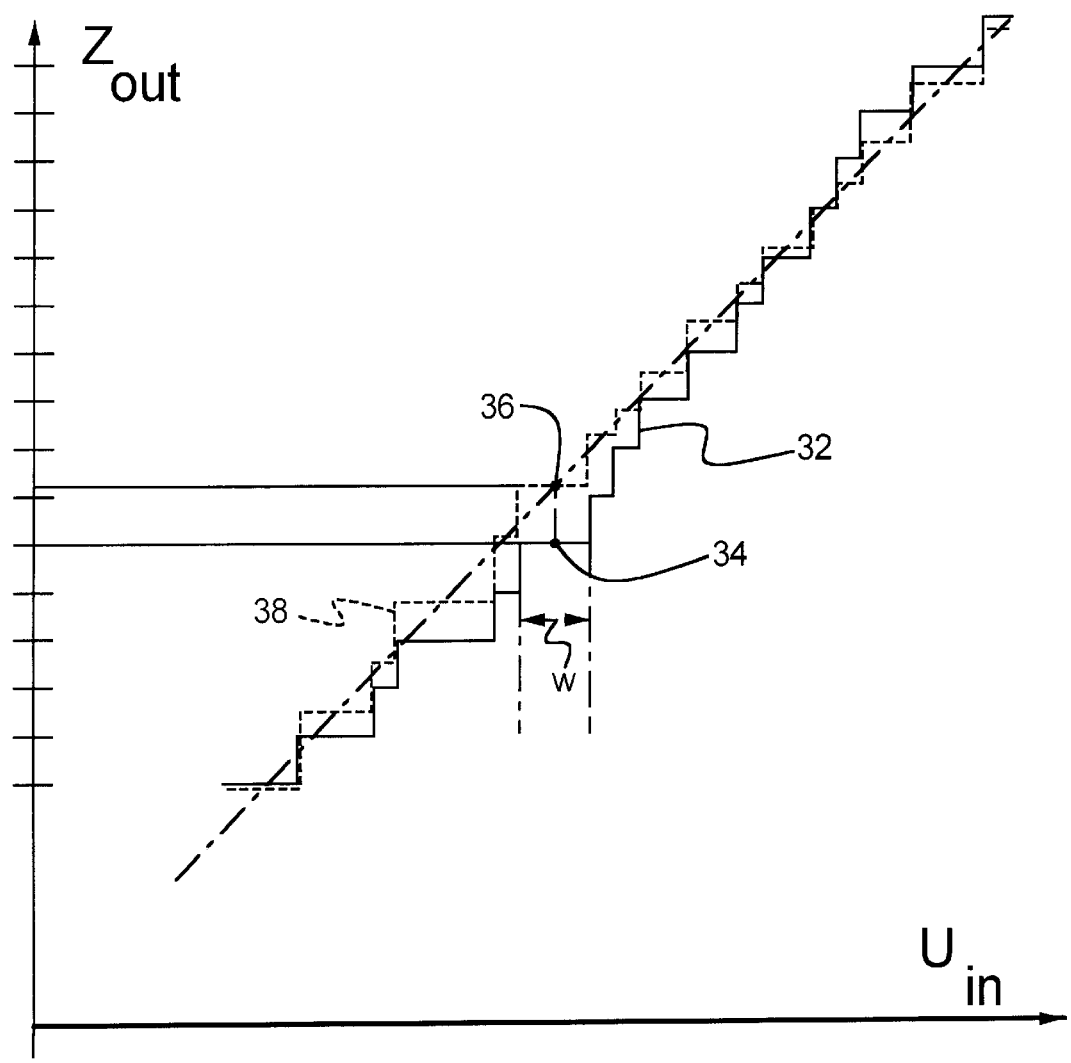
FIG. 3 is a diagram showing an excerpt from a linearized characteristic for the analog-to-digital conversion achieved in accordance with the invention.

FIG. 3 shows the correction possibilities established by the memory 28 in order to achieve a linear overall characteristic for the analog-to-digital converter circuit. The diagram shows a real characteristic 32 of an analog-to-digital converter, whereby the abscissa indicates the input voltage $U_{in}$ and the ordinate indicates the digitized output voltage $Z_{out}$ of the analog-to-digital converter 14 or 18. The characteristic 32 is fundamentally step-shaped, but the step width w can be different. The digital output value $Z_{out}$ then addresses the memory 28 in order to output a corrected output signal. As an example, FIG. 3 indicates an address value 34 emitted at the digital output 22 or 24 that causes a data value 36 at the output of the memory 28. Overall, a corrected characteristic 38 (indicated with broken lines) arises at the output of the memory 28, this being linear here. An adequately precise linearization, and thus distortion correction of the signal arises due to the larger word width of the word width output by the memory 28 (12 bit address word width, 16 bit data word width).

The characteristics deposited in the memory 28 can be additionally used to correct distortions in the preceding characteristic of the preceding signal chain, by means of inverse characteristics stored in the memory 28. The overall characteristic of the analog part—including the digitization—is then linearized. Non-linear characteristics can also be fundamentally realized.

Although modifications and changes may be suggested by those skilled in the art, it is the intention of the inventors to embody within the patent warranted herein all changes and modifications as reasonably and properly come within the scope of their contribution to the art.

We claim as our invention:

1. An analog-to-digital converter circuit for converting a high-frequency analog signal, having large dynamics between low amplitudes and high amplitudes, into a digital output signal, comprising:

a first analog-to-digital converter and a second analog-to-digital converter connected in parallel, said input signal being supplied to each of said first and second analog-to-digital converters and each of said first and second analog-to-digital converters inherently having a distortion associated therewith, each of said analog-to-digital converters having an output;

a switch having inputs respectively connected to said outputs of said first and second analog-to-digital converters, and having a switch output;

a level converter connected preceding one of said first and second analog-to-digital converters and supplied with said input signal;

a level recognition element for identifying a level range in which said input signal lies and for generating a control signal dependent on said level range, said control signal being supplied to said switch and causing said switch to be set to connect a respective one of the outputs of said first and second analog-to-digital converters to said switch output; and a correction memory having memory inputs connected to said switch output, and also supplied with said control signal, said correction memory containing datasets for respectively correcting for the distortion in each of said first and second analog-to-digital converters, each of said datasets containing address values at respective, different addresses, and said control signal addressing an address value of said correction memory for the dataset corresponding to the analog-to-digital converter connected to said switch output and causing the addressed address value to be emitted from said correction memory as a part of said digital output signal to correct for said distortion.

2. An analog-to-digital converter circuit as claimed in claim 1 wherein the respective datasets in said correction memory additionally include data for compensating for distortions introduced into said input signal upstream of said first and second analog-to-digital converters.

3. An analog-to-digital converter circuit as claimed in claim 1 wherein said first analog-to-digital converter is identical to said second analog-to-digital converter.

4. An analog-to-digital converter circuit as claimed in claim 1 wherein said level converter comprises an amplifier, and wherein said level recognition element is connected preceding said first analog-to-digital converter.

5. An analog-to-digital converter circuit as claimed in claim 1 wherein said level converter comprises an attenuator, and wherein said level recognition element is connected preceding said first analog-to-digital converter.

6. An analog-to-digital converter circuit as claimed in claim 1 wherein said level converter comprises an amplifier connected preceding said first analog-to-digital converter, said amplifier having a signal transit time associated therewith, and further comprising a delay element connected preceding said second analog-to-digital converter for compensating for said transit time in said amplifier.

7. An analog-to-digital converter circuit as claimed in claim 1 wherein each of said first and second analog-to-digital converters has a processing time associated therewith, and further comprising a digital delay element, having a transit time equal to said processing time, connected in a circuit path between said level recognition element and said correction memory.

* * * * *